United States Patent
Wang et al.

(10) Patent No.: US 11,281,305 B2
(45) Date of Patent: Mar. 22, 2022

(54) KEYBOARD WITH TOUCH SENSOR AND ILLUMINATION

(71) Applicant: Apple Inc., Cupertino, CA (US)

(72) Inventors: Paul X. Wang, Cupertino, CA (US); Chia Chi Wu, Taipei (TW); Qiliang Xu, Livermore, CA (US); Zheng Gao, Sunnyvale, CA (US); Daniel D. Sunshine, Sunnyvale, CA (US); Aidan N. Zimmerman, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/720,548

(22) Filed: Dec. 19, 2019

(65) Prior Publication Data
US 2020/0142501 A1    May 7, 2020

Related U.S. Application Data

(63) Continuation of application No. 15/690,119, filed on Aug. 29, 2017, now Pat. No. 10,514,772.
(Continued)

(51) Int. Cl.
*G06F 3/02* (2006.01)
*G06F 1/16* (2006.01)
(Continued)

(52) U.S. Cl.
CPC .......... *G06F 3/0202* (2013.01); *G06F 1/1662* (2013.01); *H03K 17/9622* (2013.01);
(Continued)

(58) Field of Classification Search
CPC . G06F 3/0202; G06F 1/1662; H03K 17/9622; H03K 17/98; H03K 2017/9602; H01H 2239/006
See application file for complete search history.

(56) References Cited

U.S. PATENT DOCUMENTS 5,736,233 A    4/1998    Fye
5,960,942 A    10/1999   Thornton
(Continued)

OTHER PUBLICATIONS

Sunshine et al., U.S. Appl. No. 15/467,986, filed Mar. 23, 2017.
(Continued)

*Primary Examiner* — Sahlu Okebato
(74) *Attorney, Agent, or Firm* — Treyz Law Group, P.C.; Tianyi He

(57) ABSTRACT

A keyboard may be provided that has keys overlapped by a touch sensor. The keyboard may have key sensor circuitry for monitoring switching in the keys for key press input. The keyboard may also have touch sensor circuitry such as capacitive touch sensor circuitry that monitors capacitive electrodes in the touch sensor for touch sensor input such as multitouch gesture input. The keyboard may include an outer layer of fabric that overlaps the keys. The fabric may have openings that are arranged to form alphanumeric characters. Light sources may emit light that passes through the openings and illuminates the alphanumeric characters. The touch sensor may have signal lines that are not visible through the openings. The signal lines may be transparent, may be covered by a diffuser, or may circumvent the openings so that they do not overlap.

18 Claims, 13 Drawing Sheets

Related U.S. Application Data

(60) Provisional application No. 62/395,254, filed on Sep. 15, 2016.

(51) Int. Cl.
  *H03K 17/98* (2006.01)
  *H03K 17/96* (2006.01)

(52) U.S. Cl.
  CPC ....... *H03K 17/98* (2013.01); *H01H 2239/006* (2013.01); *H03K 2017/9602* (2013.01)

(56) References Cited

U.S. PATENT DOCUMENTS

| | | |
|---|---|---|
| 6,947,031 B2 | 9/2005 | Sandbach et al. |
| 7,230,610 B2 | 6/2007 | Jung et al. |
| 7,365,967 B2 | 4/2008 | Zheng |
| 7,588,338 B2 | 9/2009 | Chou |
| 8,441,450 B2 | 5/2013 | Degner et al. |
| 9,092,068 B1 | 7/2015 | Hamburgen et al. |
| 9,411,436 B2 | 8/2016 | Shaw et al. |
| 10,276,326 B1 | 4/2019 | Wang et al. |
| 2002/0135457 A1 | 9/2002 | Sandbach et al. |
| 2003/0058223 A1 | 3/2003 | Tracy et al. |
| 2005/0207172 A1* | 9/2005 | Orth .................... H05B 39/085 362/395 |
| 2008/0094373 A1* | 4/2008 | Song .................... G06F 1/1662 345/173 |
| 2010/0078343 A1 | 4/2010 | Hoellwarth et al. |
| 2010/0148995 A1 | 6/2010 | Elias |
| 2010/0287679 A1* | 11/2010 | Fujita .................... D03D 1/0041 2/69 |
| 2011/0241999 A1 | 10/2011 | Thier |
| 2011/0254775 A1 | 10/2011 | Hsu |
| 2011/0291938 A1 | 12/2011 | Wu et al. |
| 2012/0012448 A1 | 1/2012 | Pance et al. |
| 2012/0327001 A1 | 12/2012 | Higginson |
| 2013/0102217 A1 | 4/2013 | Jeon |
| 2013/0229356 A1 | 9/2013 | Marwah et al. |
| 2013/0307822 A1 | 11/2013 | Huang et al. |
| 2014/0002366 A1 | 1/2014 | Glückstad et al. |
| 2014/0071654 A1* | 3/2014 | Chien .................... H01H 13/83 362/23.03 |
| 2014/0203953 A1 | 7/2014 | Moser et al. |
| 2014/0333328 A1 | 11/2014 | Nelson et al. |
| 2015/0091867 A1 | 4/2015 | Bokma et al. |
| 2015/0138096 A1* | 5/2015 | Peterson ............... G02B 6/0068 345/170 |
| 2015/0338883 A1 | 11/2015 | Farahani et al. |
| 2015/0378492 A1 | 12/2015 | Rosenberg et al. |

OTHER PUBLICATIONS

Takamatsu et al., Flexible Fabric Keyboard With Conductive Polymer-coated fibers, Conference article, Sensors, 2011 IEEE, Oct. 28-31, 2011, Limerick, Ireland.

* cited by examiner

KEYBOARD WITH TOUCH SENSOR AND ILLUMINATION

This application is a continuation of U.S. patent application Ser. No. 15/690,119, filed Aug. 29, 2017, which claims the benefit of provisional patent application No. 62/395,254, filed Sep. 15, 2016, which is hereby incorporated by reference herein in its entirety.

FIELD

This relates generally to electronic devices such as keyboards and, more particularly, to devices such as keyboards with touch sensor functionality.

BACKGROUND

Keyboards may be incorporated into laptop computers and may be used as accessories for electronic devices such as tablet computers and other devices.

Some keyboards have trackpads to allow a user to supply touch input. Due to space considerations and other constraints, it can be difficult or impossible to provide desired touch sensor functionality to components such as keyboards.

SUMMARY

A keyboard may have keys that are overlapped by a touch sensor. The keys may be pressed by a user and the touch sensor may be used to supply touch input.

Key sensor circuitry in the keyboard may be coupled to switches in the keys using traces on a printed circuit or other substrate. The switches may be mounted to the substrate under movable key members. During operation, the key sensor circuitry may monitor the switches to determine when the keys are being pressed by the user.

The keyboard may also have touch sensor circuitry. The touch sensor circuitry may be capacitive touch sensor circuitry that monitors capacitive electrodes in the touch sensor for touch input from the user.

The keyboard may include an outer layer of fabric that overlaps the keys. The fabric may have openings in the shapes of alphanumeric characters. Light sources may emit light that passes through the openings and illuminates the alphanumeric characters. The touch sensor may have signal lines that are not visible through the openings. The signal lines may be transparent, may be covered by a diffuser, or may circumvent the openings so that they do not overlap.

DETAILED DESCRIPTION

Figure 1:
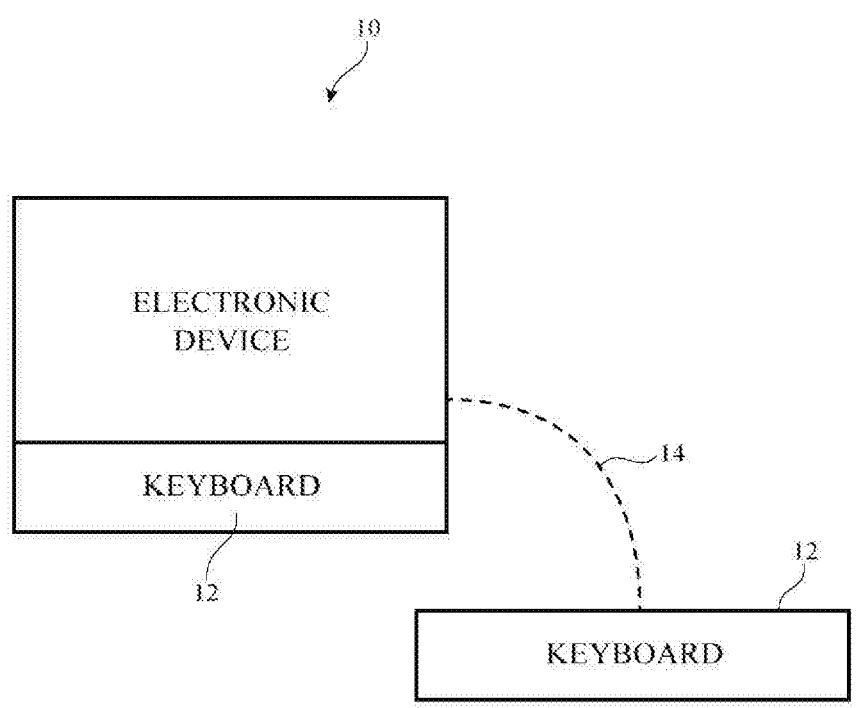
FIG. 1 is a schematic diagram of an illustrative electronic device and associated keyboards in accordance with an embodiment.

A keyboard may be provided with keys to receive keypress input from a user and may be provided with overlapping touch sensor circuitry to receive touch input from a user. An illustrative system of the type that may include keyboards is shown in FIG. 1. The system of FIG. 1 may include an electronic device such as electronic device 10. Device 10 may be an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic device 10 is mounted in a kiosk, in an automobile, airplane, or other vehicle, other electronic equipment, or equipment that implements the functionality of two or more of these devices. If desired, electronic device 10 may be a removable external case for electronic equipment or other device accessory, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable device that includes circuitry.

Keyboards 12 may be used to gather input from a user. As shown in FIG. 1, keyboards 12 may be incorporated into electronic devices such as device 10 or may be coupled to electronic devices such as device 10 via a path such as path 14. Path 14 may be a wired or wireless path. Configurations in which device 10 includes an embedded keyboard 12 and is also coupled to a stand-alone external keyboard 12 by path 14 may be used, if desired.

Figure 2:
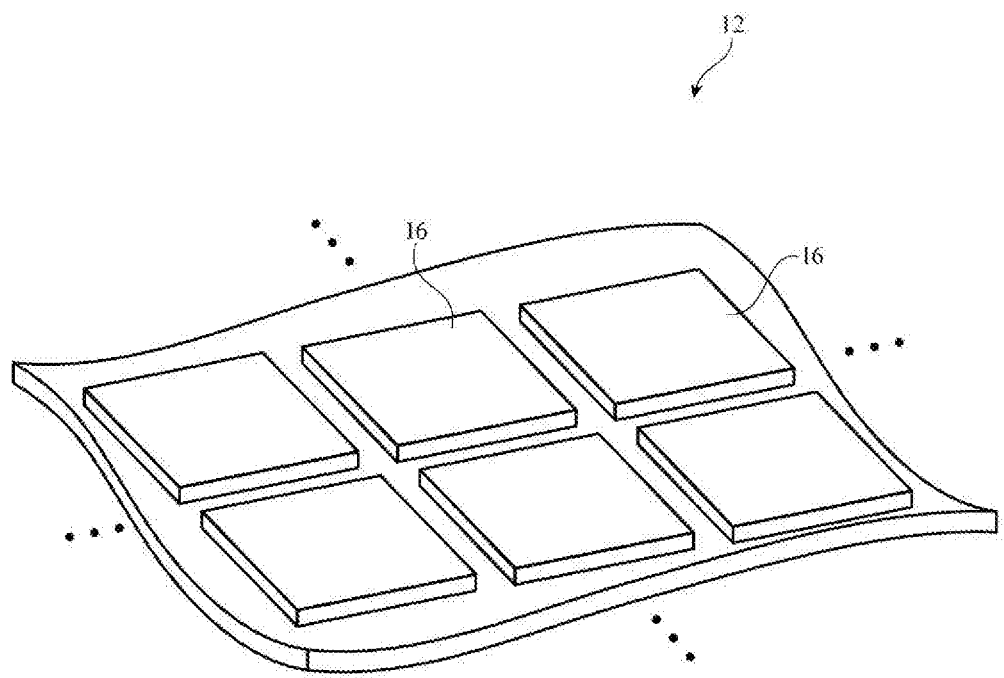
FIG. 2 is a perspective view of a portion of a keyboard in accordance with an embodiment.

FIG. 2 is a perspective view of a portion of keyboard 12. As shown in FIG. 2, keyboard 12 may have an array of keys 16. Keys 16 may be pressed by a user to supply keyboard 12 with keypress input (keypress events). Keys 16 may be alphanumeric keys, may be keys labeled with text (e.g., "backspace," "shift," etc.), may serve as function keys, may include special-function keys (e.g., keys to alter the magnification of on-screen content, keys for placing a device in a sleep mode, etc.), may be single-function or multi-function buttons, may be alphanumeric keys arranged in a QWERTY format, may be arranged in rows and columns or other patterns, may be configured to form other types of keyboard devices (e.g., numeric keypads, etc.), or may be any other suitable keys.

Figure 3:
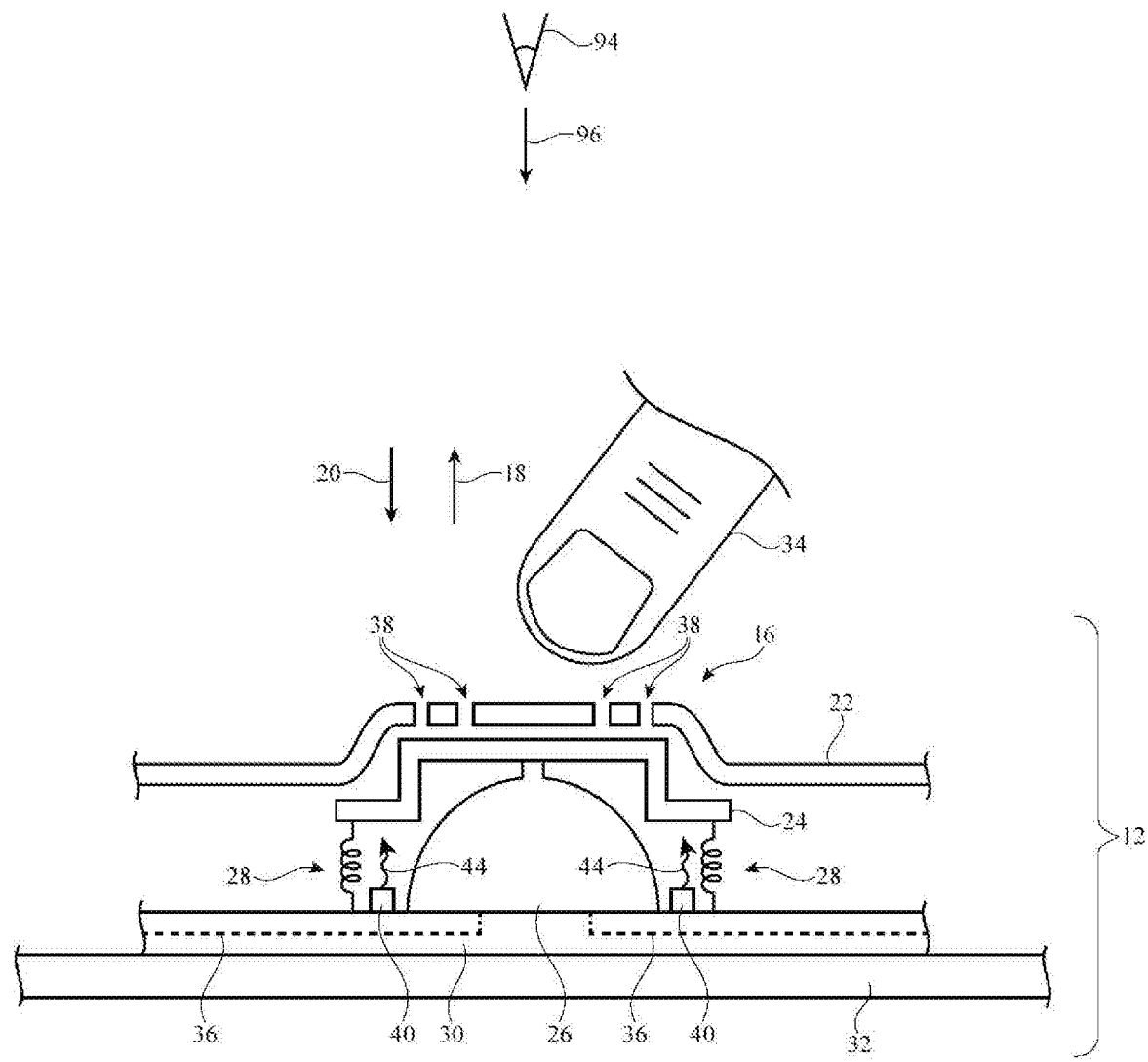
FIG. 3 is a cross-sectional side view of an illustrative key in a keyboard in accordance with an embodiment.

A cross-sectional side view of an illustrative key in keyboard 12 is shown in FIG. 3. As shown in FIG. 3, a user's finger (finger 34) or other external object may be used to press down (inwardly) on key 16 in direction 20. Key 16 may have a movable key member such as movable key member 24 (sometimes referred to as a key cap). When pressed in direction 20, key member 24 may move in direction 20 and may press against and close switch 26 (e.g., a dome switch or other suitable switch with open and closed states). In response to closing switch 26, keyboard control circuitry in keyboard 12 may detect a keypress event and may supply the keypress information to control circuitry in device 10. The keypress event may then be used as a control input for keyboard 12 and/or device 10.

Springs or other biasing structures such as biasing structures 28 may be used to restore key 16 to its original undepressed state after pressure from finger 34 is released (i.e., biasing structures 28 may push key member 24 upwards in direction 18 when a user lifts finger 34 off of key 16). Biasing structures 28 may be formed from springy structures such as foam, elastomeric polymer, spring metal, etc. If desired, biasing structures 28 may be implemented using a scissor-shaped structure with springs that support and bias key member 24 upwards. Other types of structures for supporting and biasing key members 24 for keys 16 may be used, if desired.

As shown in FIG. 3, keyboard 12 may have a housing such as housing 32. Housing 32 may be formed from one or more layers of material such as plastic, metal, fabric, and other materials. Keyboard substrate 30 may be mounted within housing 32. Biasing structures 28 may be coupled between movable key members such as key member 24 and substrate 30 and/or may be coupled between key member 24 and housing 32 or other structures in keyboard 12.

Keyboard substrate 30 may include signal traces 36 that allow control circuitry to communicate with keys 16 (e.g., traces that allow circuitry to monitor switches 26). Substrate 30 may be, for example, a printed circuit (e.g., a flexible printed circuit formed from a sheet of polymer with metal traces or a rigid printed circuit formed form a rigid printed circuit board material such as fiberglass-filled epoxy). Switches 26 may be mounted to substrate 30 (e.g., with solder, conductive adhesive, welds, etc.). Traces 36 on substrate 30 may be coupled between the switch 26 of each key 16 and associated key sensor circuitry so that the circuitry may detect keypress events (i.e., so that the circuitry can determine which keys 16 have been depressed by monitoring which switches 26 have been closed).

Key members 24 may be covered with one or more layers of plastic, metal, fabric, or other materials (see, e.g., illustrative layer 22). To help ensure that the shape of layer 22 conforms to the raised key shapes of keys 16, layer 22 may be debossed (embossed) in a die (e.g., a heated die with key-shaped impressions that compresses layer 22 between opposing upper and lower structure into the shapes of keys 16). Laser processing techniques and/or other techniques may be used to form perforations and/or other openings in layer 22, may be used to selectively cut fibers, and/or may otherwise be used to process portions of the material of layer 22 (e.g., to adjust key stiffness, keyboard appearance, and/or other attributes of keyboard 12).

Keyboard 12 may have light-transmitting regions that provide illumination for keys 16. For example, keyboard 12 may have light-transmitting regions formed from openings 38 in layer 22 that allow light 44 from light sources 40 to pass through layer 22 and thereby illuminate keys 16 for a user.

As shown in FIG. 3, a viewer such as viewer 94 may view keyboard 12 in direction 96. A light source such as light source 40 may be formed in the interior of keyboard 12. Light source 40 may be formed from one or more light-emitting diodes (e.g., organic light-emitting diodes, light-emitting diode dies formed from crystalline semiconductor, quantum dot light-emitting diodes, light-emitting diodes with phosphors, etc.) or may be formed from other light-emitting structures. With one illustrative configuration, which may sometimes be described herein as an example, light sources for item 10 such as light source 40 may be formed from micro-light-emitting diodes (e.g., small crystalline light-emitting diodes having dimensions of 100 microns or less, 200 microns or less, 20-200 microns, more than 10 microns, less than 500 microns, or other suitable size). Other types of light-emitting devices (e.g., lasers, electroluminescent panels, etc.) may be used in providing illumination for keyboard 12 if desired. The use of micro-light-emitting diodes for forming light source(s) 40 is merely illustrative. Light sources for item 10 may generate light at visible wavelengths, infrared wavelengths, and/or ultraviolet wavelengths (see, e.g., light 44 of FIG. 3). If desired, luminescent material (e.g., phosphors formed from phosphorescent materials, fluorescent dyes, a polymer or other material containing quantum dots, etc.) may be used in converting light to desired wavelengths.

Layer 22 may have openings such as openings 38. Openings 38 may have the shape of an alphanumeric character or other symbol (glyph) or may have any other suitable shape. As shown in FIG. 3, openings 38 (i.e., the symbol, label, or other patterned structure formed from openings 38) may be illuminated with illumination 44 (i.e., illumination 44 may serve as backlight for an illuminated area formed from opening 38). Because openings 38 may have a shape that forms a symbol or other desired pattern, openings such as opening 38 of FIG. 3 may sometimes be referred to as patterned openings or illuminated regions.

Openings such as openings 38 of FIG. 3 may be formed by stamping (punching), cutting, machining, plasma cutting, waterjet cutting, heating, ablation, chemical removal (e.g., polymer dissolving techniques, metal etching techniques, etc.), laser-based techniques (sometimes referred to as laser hole formation or laser drilling), and/or other suitable material removal techniques. Openings such as openings 38 may also be formed during the process of fabricating some or all of layer 22 (e.g., by molding openings into layer 22 as layer 22 is formed during a plastic molding process, by intertwining strands of material so that openings are formed as layer 22 is constructed, or by using other fabrication techniques in which openings such as opening 38 are formed during fabrication of layer 22 rather than by removing material from layer 22 after layer 22 has been fabricated).

Figure 4:
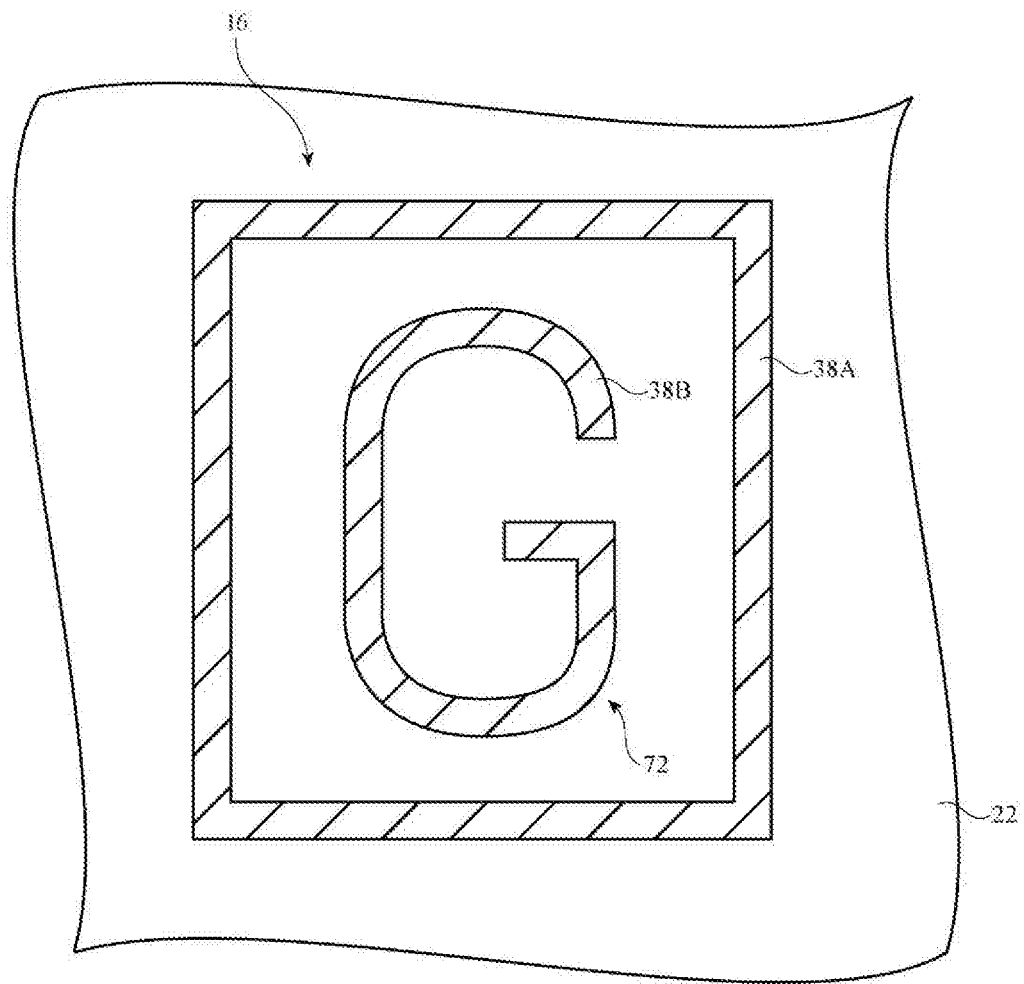
FIG. 4 is a top view of an illuminated structure such as a keyboard key in accordance with an embodiment.

Patterned openings in fabric and/or other materials (see, e.g., layer 22 of FIG. 3) may be used in forming illuminated regions in item 10. As shown in FIG. 4, layer 22 may overlap an input-output component such as key 16. Key 16 may be surrounded by an illuminated region such as opening 38A that forms an illuminated trim (i.e., an illuminated ring-shaped halo that runs around the periphery of key 16). Key 16 may also have an illuminated region such as region 38B. Region 38B may form a symbol or other pattern. For example, illuminated region 38B may form a label for key 16 (e.g., region 38B may be patterned to form an alphanumeric character 72 such as the letter "G" or other symbol associated with the operation of the key). Regions such as regions 38A and 38B may be formed from transparent portions of an opaque layer (e.g., perforations or larger openings in a fabric or other material that are filled with transparent material, air-filled openings, etc.). In some configurations, printed ink or other coating material may be provided on layer 22 (e.g. on the outer surface of layer 22) to help make a label on key 16 visible to a user in the absence of illumination through regions 38A and/or 38B.

Although illustrative illuminated regions 38A and 38B of FIG. 4 are associated with an input-output device such as key 16 in keyboard 12, this is merely an example. Regions such as regions 38A and 38B may have any suitable size and shape, may be formed on any suitable portion of electronic device 10, may form labels, symbols, text, decorative patterns (e.g., trim), parts of status indicators, parts of displays, parts of buttons (e.g., buttons such as power buttons, volume buttons, sleep/wake buttons, and other buttons besides the keys in a keyboard), may be formed on surfaces of electronic device 10 that are not associated with keys, etc. The illuminated key configuration of FIG. 4 is merely an example.

In addition to pressing on desired keys 16 to supply keypress input, a user of keyboard 12 may desire to supply keyboard 12 with touch input. Keyboard 12 may, if desired, be provided with a trackpad (e.g., a capacitive touch sensor with a rectangular outline or other suitable shape that is used to gather touch input from a user). A trackpad may, as an example, be located below rows of keys in the middle of keyboard 12.

Keyboard 12 may also be provided with a touch sensor that overlaps one or more of keys 16. This touch sensor may be formed from capacitive touch sensor electrodes or other touch sensor structures. With one illustrative configuration, keyboard 12 may incorporate a touch sensor that is formed from conductive strands of material in a layer of fabric (see, e.g., layer 22 of FIG. 3). The conductive strands in a fabric touch sensor may include horizontal strands of material that overlap with perpendicular vertical strands of material to form a grid of touch sensor electrodes that intersect at an array of intersection locations. In other arrangements, the touch sensor in keyboard 12 may be formed from conductive signal traces on the surface of a fabric layer or other substrate (e.g., a substrate formed from polymer or other suitable material).

The touch sensor in keyboard 12 may, as an example, overlap most or all of keys 16 and thereby may serve as a keyboard-sized integral touch surface with which a user may supply touch input (multitouch gestures, single-finger pointer-control input for an on-screen cursor, swipes, taps, and other touch commands). To conserve space in this type of keyboard, it may be desirable to omit any separate trackpads (i.e., keyboard 12 may be formed from an array of keys and a touch sensor that extends over some or all of the keys and need not have any separate trackpad structures). Configurations of this type may sometimes be described herein as an example. In general, keyboard 12 may include any suitable input-output devices (e.g., buttons, capacitive touch sensors or other touch sensors, etc.).

Figure 5:
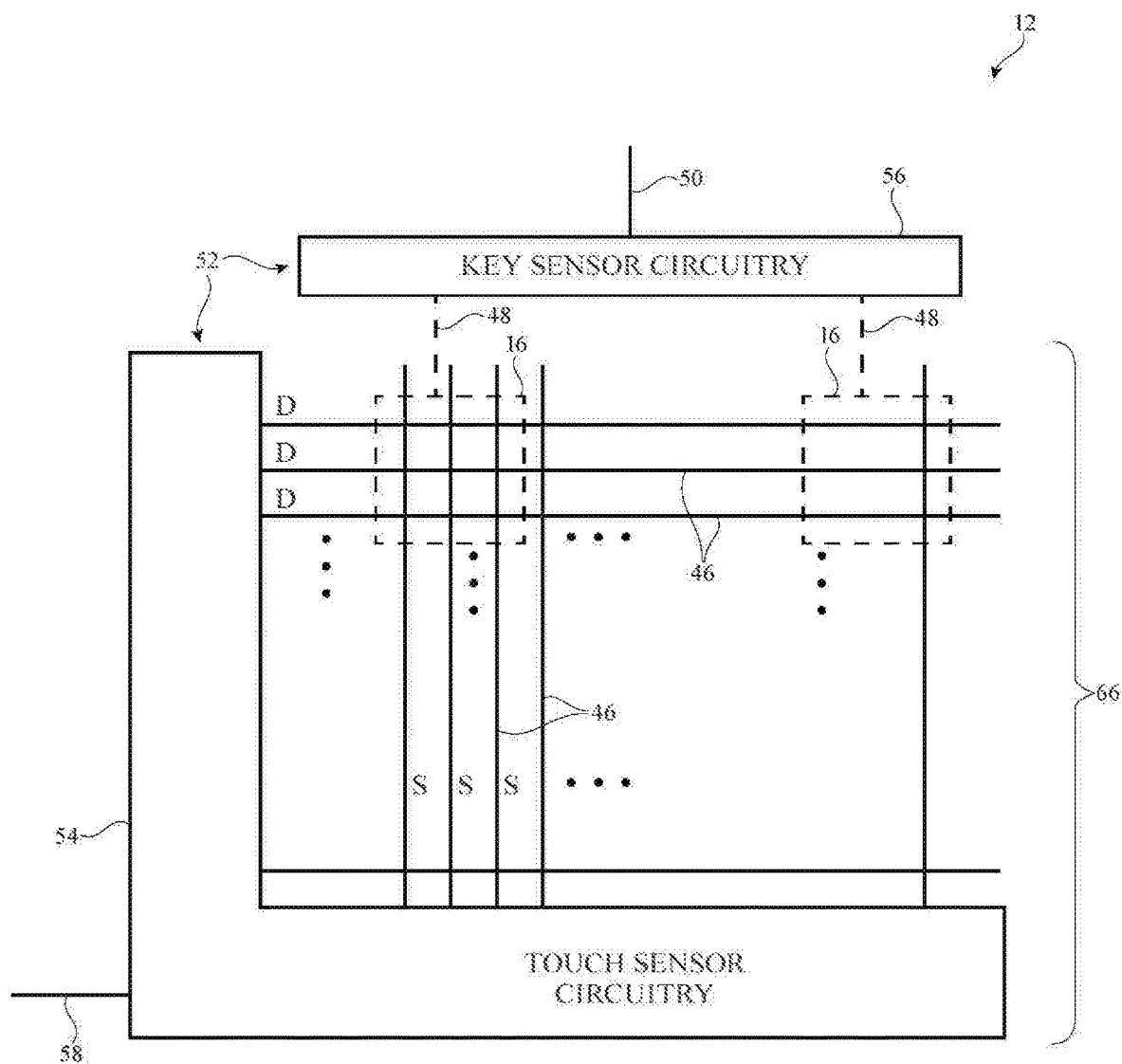
FIG. 5 is a circuit diagram of an illustrative keyboard with keys and an overlapping grid of touch sensor electrodes in a capacitive touch sensor in accordance with an embodiment.

FIG. 5 is a circuit diagram of an illustrative keyboard having a touch sensor such as touch sensor 66. As shown in FIG. 5, keyboard 12 may include control circuitry 52 such as touch sensor circuitry 54 and key sensor circuitry 56. Keyboard 12 may have an array of switches 26 (FIG. 3) associated with a corresponding array of keys 16.

Signal paths such as paths 48 (e.g., traces 36 on substrate 30) may be used to couple key sensor circuitry 56 to the switches 26 of keys 16. Whenever a user presses on a given one of keys 16, the switch 26 in that key will change state (e.g., from open to closed). Sensor circuitry 56 monitors the status of all of switches 26 in keyboard 12 and, in response to detection of a change of switch state, generates corresponding output signals on path 50 (e.g., signals that inform control circuitry in device 10 or other equipment of each detected key press event).

Conductive lines 46 may serve as capacitive electrodes in capacitive touch sensor 66 (e.g., a touch sensor grid) that overlaps keys 16. Any suitable number of horizontal and vertical lines 46 may overlap each key 16. For example, there may be 1-5, more than 2, more than 3, 2-4, fewer than 10, fewer than 5, or other suitable number of horizontal lines 46 overlapping each key 16 and there may be 1-5, more than 2, more than 3, 2-4, fewer than 10, fewer than 5, or other suitable number of vertical lines 46 overlapping each key 16. Conductive lines 46 may be formed from patterned thin-film metal traces on layer 22, may be formed from conductive strands of material in a layer of fabric, may be formed from patterned traces on a layer that is separate from outer layer 22 such as a layer of polymer or other material, and/or may be formed from other conductive structures that form capacitive touch sensor electrodes.

As shown in FIG. 5, touch sensor 66 includes touch sensor circuitry 54 coupled to a set of horizontal lines 46 and a perpendicular set of vertical lines 46. Touch sensor circuitry 54 may provide drive signals D to one of these sets of lines 46 (i.e., horizontal lines 46 in the example of FIG. 5) and may gather corresponding sense signals S on the other of these sets of lines 46 (i.e., vertical lines 46 in the example of FIG. 5). Capacitive coupling between the drive and sense lines varies in the presence of a user's finger over a drive-line-to-sense-line intersection. As a result, touch sensor circuitry 54 can process the drive and sense signals to determine which of the intersections of the horizontal and vertical lines 46 are being overlapped by a user's finger(s) or other external objects. When touch input is detected in this way, touch sensor circuitry 54 may provide a processor or other control circuitry in device 10 or other equipment with information on the touch input using a path such as path 58.

In a typical scenario, a user may enter text or other key press input into keyboard 12 by typing on keys 16. Key sensor circuitry 56 may convey information on the text or other input that the user is typing into keyboard 12 over path 50. When the user desires to reposition an on-screen cursor, to make a multitouch gesture (e.g., a pinch-to-zoom gesture, a two-finger swipe, a three-finger swipe, a two-finger or three-finger tap, etc.), to make a one-finger swipe or other gesture, or to supply keyboard 12 with other touch input, the user may move one or more of the user's fingers across the surface of keys 16. During touch input events such as these, touch sensor circuitry 54 may monitor capacitance changes at the intersections of the horizontal and vertical capacitive touch sensor electrodes (paths 46) to gather touch input data and may supply the touch input that is gathered from the capacitive touch sensor electrodes to control circuitry such as control circuitry in device 10 and/or control circuitry in keyboard 12 via path 54.

Touch sensor electrodes 46 may be formed from conductive strands of material in layer 22. Layer 22 may, as an example, include fabric. The fabric may be woven, knitted, or braided and/or may include strands of material that have been intertwined using other techniques (e.g., felt). With one suitable arrangement, the fabric of layer 22 may be woven fabric and electrodes 46 may be formed from selected warp and weft strands in the woven fabric, as shown in FIG. 6.

Figure 6:
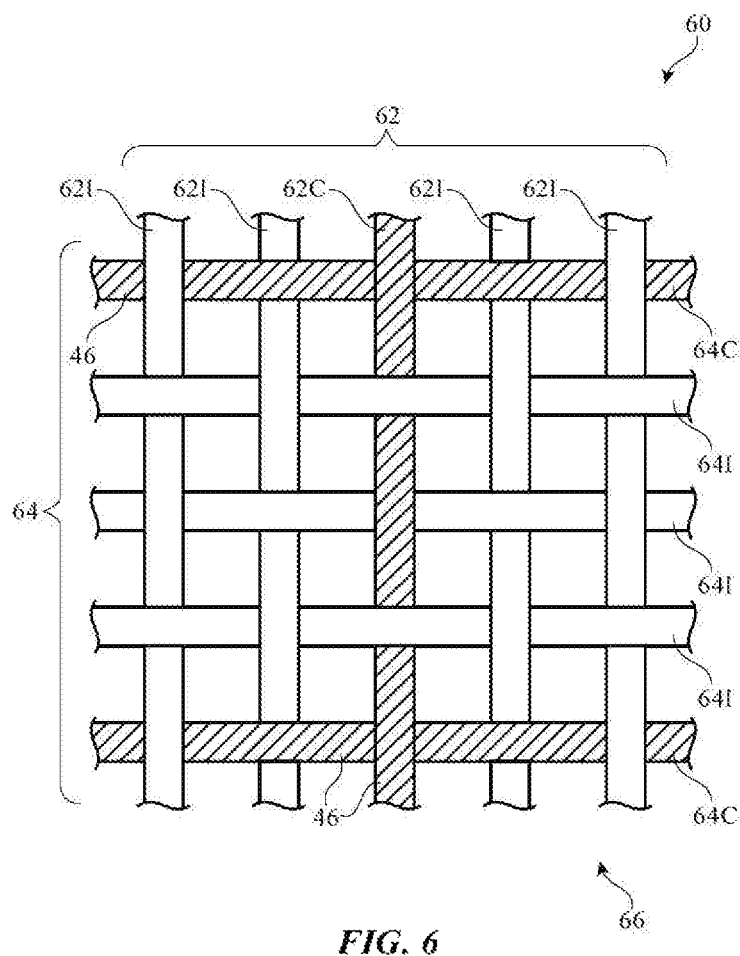
FIG. 6 is a top view of an illustrative fabric for a keyboard in accordance with an embodiment.

FIG. 6 is a top view of an illustrative arrangement in which touch sensor 66 is incorporated into a fabric layer such as fabric 60. Fabric 60 may be used as the outer layer of keyboard 12 (e.g., fabric 60 may form layer 22 of FIG. 3) or fabric 60 may be located behind an outer layer of keyboard 12 (e.g., fabric 60 may be located under layer 22 of FIG. 3). As shown in FIG. 6, fabric 60 may include warp strands 62 and weft strands 64. Warp strands 62 run along a first dimension of fabric 60 (e.g., the vertical dimension in the orientation of FIG. 6) and weft strands 64 run perpendicularly along a second dimension of fabric 60 (e.g., the horizontal dimension in the orientation of FIG. 6). Some of warp strands 62 such as strands 62I may be insulating and some of strands 62 such as strands 62C may be conductive and may therefore serve as the vertically extending electrodes 46 in touch sensor 66. Some of weft strands 64 such as weft strands 64I may be insulating and some of strands 64 may be conductive such as strands 64C and may therefore serve as horizontally extending electrodes 46 in touch sensor 66. Woven fabric 60 of FIG. 6 has a plain weave, but in general, fabric 60 may have any suitable construction (e.g., fabric 60 may have a basket weave, may be knitted, may be braided, or may have any other suitable fabric construction). Plain weave fabric constructions may sometimes be described herein as an example.

The strands of material in fabric 60 such as strands 62 and 64 may each include one or more monofilaments (sometimes referred to as fibers or monofilament fibers). The monofilaments may have one or more layers (e.g., a core layer alone, a core layer with an outer coating, a core layer with an inner coating layer that is covered with an outer coating layer, a core layer coated with three or more additional layers, etc.). Strands of material that are formed from intertwined monofilaments may sometimes be referred to as yarns, threads, multifilament strands or fibers, etc. In general, any suitable types of strands or combination of different types of strands may be used in forming fabric 60 (e.g., monofilaments, yarns formed from multiple monofilaments, etc.). Strands with multiple monofilaments may have 2-200 monofilaments, 2-50 monofilaments, 2-4 monofilaments, 2 monofilaments, 4 monofilaments, fewer than 10 monofilaments, 2-10 monofilaments, fewer than 6 monofilaments, more than 2 monofilaments, or other suitable number of monofilaments.

Insulating strands may be formed from one or more dielectric materials such as polymers, cotton and other natural materials, etc. Conductive strands may be formed from metal or other conductive material and optional dielectric. For example, conductive strands may be formed from solid monofilament wire (e.g., copper wire), wire that is coated with one or more dielectric and/or metal layers (e.g., copper wire that is coated with polymer), a monofilament of polymer coated with metal or other conductive material, a monofilament of polymer coated with metal that is covered with an outer polymer coating, etc. The diameter of the monofilaments may be 5-200 microns, more than 10 microns, 20-30 microns, 30-50 microns, more than 15 microns, less than 200 microns, less than 100 microns, or other suitable diameter. The thickness of each of the coatings in a monofilament may be less than 40% of the diameter of the monofilament, less than 10% of the diameter, less than 4% of the diameter, more than 0.5% of the diameter, 1-5% of the diameter, or other suitable thickness. If desired, conductive monofilaments may be intertwined to form conductive yarn. Conductive yarn may include only conductive monofilaments or may include a combination of conductive monofilaments and insulating monofilaments.

Figure 7:
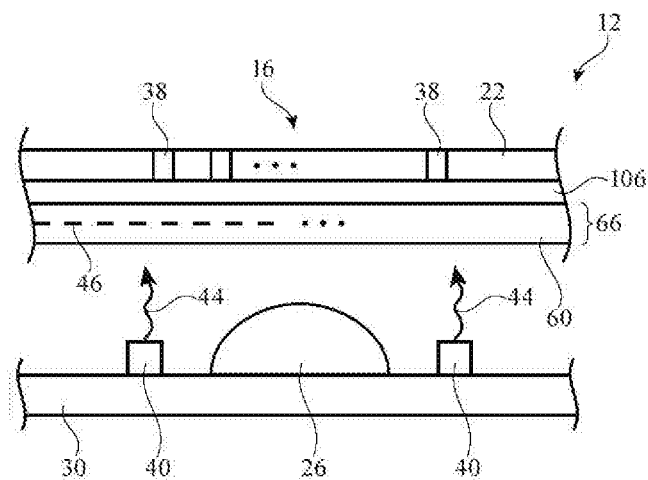
FIG. 7 is a cross-sectional side view of an illustrative keyboard key that is overlapped by a fabric touch sensor and an outer fabric layer in accordance with an embodiment.

If desired, conductive strands of material and other structures in fabric 60 that are associated with forming touch sensor 66 may be hidden from view by covering fabric 60 with an additional layer of material. This type of arrangement is shown in FIG. 7. Fabric 60 (e.g., woven fabric with sets of horizontal and vertical conductive strands of material that serve as capacitive touch sensor electrodes as described in connection with FIG. 6) may be located under outer layer 22 of keyboard 12. Outer layer 22 may cover touch sensor 66 and may therefore hide touch sensor 66 from view. Outer layer 22 may be a layer of plastic, a layer of fabric, and/or one or more layers of other materials. Outer layer 22 may be formed solely from insulating strands and/or may be formed from strands of other materials that provide keyboard 12 with an attractive external appearance. Adhesive 106 may be used in attaching outer layer 22 to touch sensor layer 66.

Outer layer 22 may have openings 38 for allowing light 44 from light sources 40 to pass through outer layer 22 and thereby illuminate key 16. Openings 38 may, for example, be an array of small perforations that are arranged to form a glyph or other shape as a label for key 16 (e.g., openings 38 may be arranged in the shape of a "G" or other character as in the example of FIG. 4).

In some arrangements, signal lines 46 in touch sensor 66 may be formed from non-transparent materials such as metal. If care is not taken, signal lines 46 in touch sensor 66 may block some of light 44 and/or may be visible to a user through openings 38.

To help minimize the visibility of signal lines 46 through openings 38, light-diffusing material may be located in openings 38 to help obscure lines 46 of touch sensor 66. For example, material in openings 38 may contain metal oxide particles or other light scattering particles that render openings 38 translucent. With this type of arrangement, the light diffusing material in openings 38 may help hide signal lines 46 from view by a user.

Figure 8:
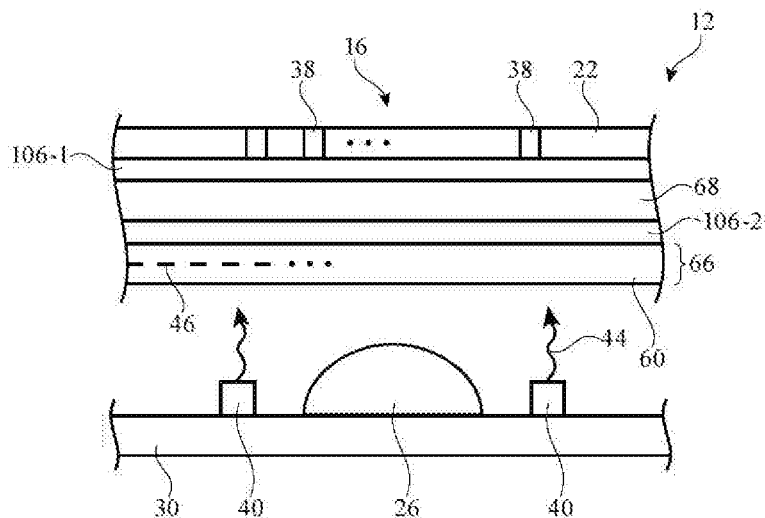
FIG. 8 is a cross-sectional side view of an illustrative keyboard key that is overlapped by a fabric touch sensor, a diffuser, and an outer fabric layer in accordance with an embodiment.

If desired, a separate light-diffusing layer may be used to diffuse light over touch sensor 66 and thereby help minimize the appearance of signal lines 46. An example of this type of arrangement is shown in FIG. 8. As shown in FIG. 8, a light-diffusing layer such as diffuser 68 may be interposed between outer layer 22 and fabric 60 of touch sensor 66. Diffuser 68 may be formed from one or more layers of polymer and may include light-scattering features such as voids, inorganic light-scattering particles, other light-scattering structures, dyes, pigments, etc. Diffuser 68 may be attached to outer layer 22 using adhesive 106-1 and attached to fabric 60 of touch sensor 66 using adhesive 106-2.

Figure 9:
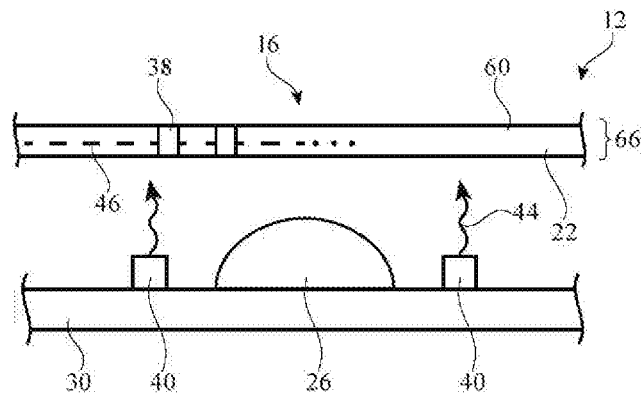
FIG. 9 is a cross-sectional side view of an illustrative keyboard key that is overlapped by a fabric touch sensor in accordance with an embodiment.

If desired, touch sensor 66 may be integrated into outer layer 22 of keyboard 12, as shown in the example of FIG. 9. With this type of arrangement, outer layer 22 may be formed from a touch sensing fabric such as touch sensing fabric 60 of FIG. 6. Conductive strands in fabric 60 of layer 22 may be made visually indistinct from insulating strands in fabric 60 by matching the size and/or color of the insulating and conductive strands. For example, the diameters of the conductive strands and insulating strands may differ by less than 50%, less than 20%, less than 5%, 1-10%, more than 0.1%, or other suitable amount so that the conductive strands are not visibly distinct from the insulating strands. The conductive strands may also be coated with colored polymer having a color that matches the color of the insulating strands of material in fabric 60 or may otherwise be treated so that the appearance of the conductive strands matches that of the insulating strands. As an example, fabric 60 and/or the conducting and/or insulating strands may be coated with a colored polymer treatment (e.g., a colored ink coating such as a gray, black, or white coating, etc.). If desired, conductive strands may be formed from conductive monofilaments that are surrounded by intertwined insulating monofilaments, thereby hiding the conductive material in the conductive strands from view. The insulating monofilaments in conductive strands with this type of arrangement may have the same appearance (e.g., the same color) as insulating monofilaments in insulating strands of material in fabric 60 (as an example).

Incorporating touch sensor signal lines 46 into outer layer 22 of keyboard 12 reduces the number of layers that light 44 must pass through to exit through openings 38, which in turn can help increase the brightness efficiency of the keyboard.

Figure 10:
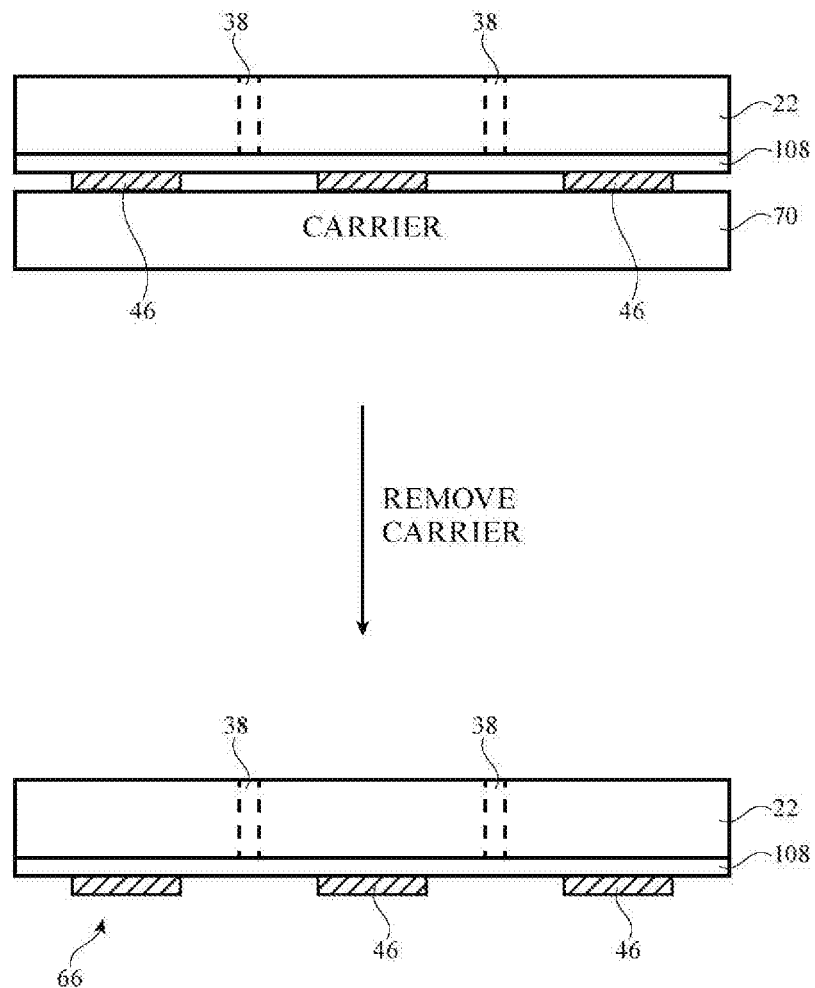
FIG. 10 is a diagram showing illustrative steps involved in forming touch sensor signal lines on an outer fabric layer for a keyboard in accordance with an embodiment.

If desired, touch sensor signal lines 46 may be formed on the surface of outer layer 22 rather than being incorporated as threads in outer layer 22. FIG. 10 is a diagram illustrating how touch sensor signal lines 46 may be formed on an inner surface of outer layer 22. As shown in FIG. 10, touch sensor traces 46 may be formed on a carrier layer such as carrier layer 70. Carrier layer 70 may be a substrate formed from metal, polymer, ceramic, or other suitable material. Touch sensor signal lines 46 may be formed from flexible material such as polymer (e.g., silicone or other polymer) that has been doped with conductive filler (e.g., particles of metal, particles of carbon nanotube material, graphene particles, fibrous carbon material, or other conductive particles).

Carrier substrate 70 on which touch sensor signal lines 46 are formed may be attached to substrate 22 using adhesive 108 (e.g., epoxy, silicone, urethane, polyurethane such as thermoplastic polyurethane, acrylic, polyester, other polymers, or other suitable materials). Layer 108 may also help provide a waterproof sealant on outer layer 22 to prevent moisture and other contaminants from entering keyboard 12 through outer layer 22. Once attached, touch sensor signal lines 46 may be sandwiched between layer 22 and carrier 70.

After attaching carrier layer 70 and touch sensor signal lines 46 to layer 22, carrier layer 70 may be removed, as shown in FIG. 10. Carrier 70 may be removed by ablation, cutting, machining, plasma cutting, waterjet cutting, heating, chemical removal (e.g., polymer dissolving techniques, metal etching techniques, etc.), and/or other suitable material removal techniques.

Following removal of carrier layer 70, only touch sensor signal lines 46 may remain on outer layer 22. Openings 38 may be formed in layer 22 prior to attaching layer 22 to carrier 70, after attaching layer 22 to carrier 70, or after removing carrier 70 from layer 22. As in the example of FIG. 9, integrating touch sensor signal lines 46 with outer layer 22 helps reduce the number of layers that light needs to pass through provide illumination for keys 16 of keyboard 12.

The example of FIG. 10 in which traces 46 are formed on carrier 70 and subsequently attached to layer 22 is merely illustrative. If desired, traces 46 may be formed directly on layer 22 without the use of a carrier substrate.

Figure 11:
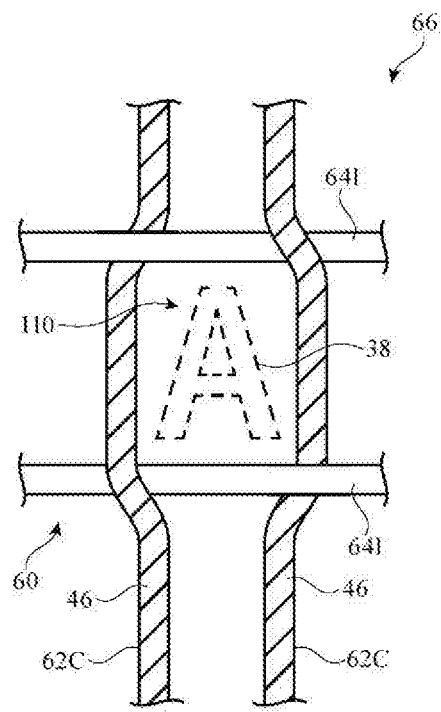
FIG. 11 is a top view of an illustrative touch sensor fabric in which touch sensor signal lines circumvent an opening that forms an alphanumeric character for a key in accordance with an embodiment.
Figure 12:
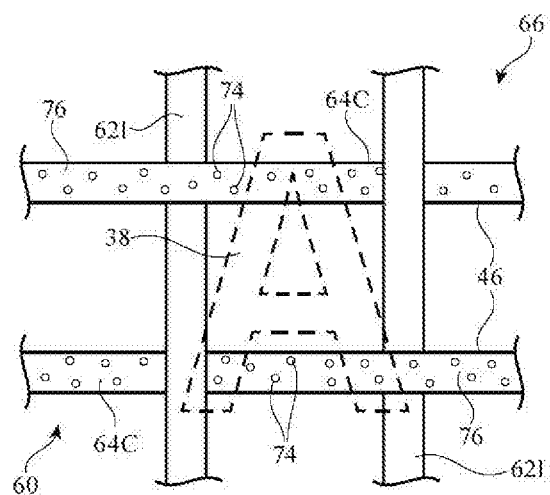
FIG. 12 is a top view of an illustrative touch sensor fabric in which touch sensor signal lines are at least partially transparent in accordance with an embodiment.

In arrangements of the type shown in FIGS. 7, 8, and 9 where touch sensor signal lines 46 are formed from conductive strands in fabric 60 (e.g., a fabric of the type shown in FIG. 6), care must be taken to ensure that signal lines 46 are not visible through openings 38. FIGS. 11 and 12 show illustrative arrangements in which touch sensor signal lines 46 are formed in fabric 60 and are modified to minimize their visibility through openings 38. If desired, the arrangements of FIGS. 11 and 12 may be used in fabric 60 when fabric 60 is behind outer layer 22 (as in the example of FIG. 7), when fabric 60 is behind outer layer 22 and behind a diffusing layer (as in the example of FIG. 8), when fabric 60 is used to form outer layer 22 (as in the example of FIG. 9), and any other suitable arrangement in which touch sensor signal lines 46 are formed from conductive strands in a layer of fabric.

In the example of FIG. 11, the conductive strands that form touch sensor signal lines 46 (e.g., conductive strands 62C) are specifically placed in fabric 60 to avoid overlapping openings 38. In other words, adjacent signal lines 46 may spread apart from one another to form a gap such as gap 110 that overlaps opening 38. In arrangements where fabric 60 is behind outer layer 22 in keyboard 12 (as in the examples of FIGS. 7 and 8), openings 38 may be formed in outer layer 22 and light 44 may pass through gap 110 to reach opening 38 in outer layer 22. In arrangements where fabric 60 forms outer layer 22, opening 38 may be formed in fabric 60. The arrangement of FIG. 11 in which only four strands in fabric 60 are shown surrounding opening 38 is merely illustrative. Additional strands may be located between the two conductive strands 62C and between the two insulating strands 64I that are shown in FIG. 11. By circumventing opening 38 such that signal lines 46 and openings 38 are non-overlapping, signal lines 46 may be out of a user's sight and undetectable through openings 38.

In the example of FIG. 12, signal lines 46 of touch sensor 60 are formed from transparent or semi-transparent materials. For example, conductive strands 64C in fabric 60 may be formed from a fully or semi-transparent material such as clear polymer 76. Polymer 76 may include conductive filler such as conductive particles 74 (e.g., particles of metal, particles of carbon nanotube material, graphene particles, fibrous carbon material, or other conductive particles). With this type of arrangement, signal lines 46 that overlap openings 38 will not be visible by a user because light 44 from light source 40 (FIG. 3) will be transmitted through the conductive strands that form signal lines 46.

If desired, touch sensor 66 need not be formed from a fabric layer. In particular, touch sensor signal lines 46 may be formed from traces that are formed on a carrier substrate or that are formed directly on outer layer 22 (as in the example of FIG. 10).

Figure 13:
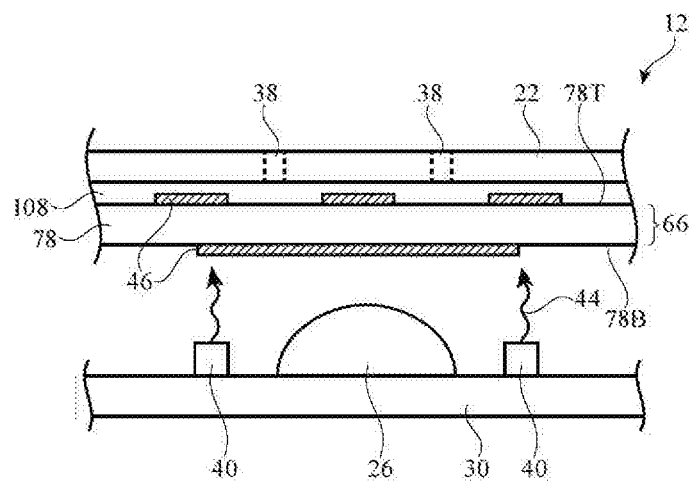
FIG. 13 is a cross-sectional side view of an illustrative keyboard key that is overlapped by a touch sensor substrate and an outer fabric layer in accordance with an embodiment.

In FIG. 13, for example, touch sensor traces 46 are formed on top surface 78T and bottom surface 78B of carrier layer 78. Carrier layer 78 may be a thin film of polymer or other substrate and may be semi-transparent or fully transparent. Touch sensor signal lines 46 may be formed from flexible conductive material such as polymer (e.g., silicone or other polymer) that has been doped with conductive filler (e.g., particles of metal, particles of carbon nanotube material, graphene particles, fibrous carbon material, or other conductive particles). In one illustrative arrangement, signal lines 46 are formed from optically clear silicone that includes conductive particles. Signal lines 46 may be fully transparent or the silicone may be light-diffusing silicone and may only be 70-80% transparent, if desired.

Carrier layer 78 may be attached to substrate 22 using adhesive 108 (e.g., epoxy, silicone, urethane, polyurethane such as thermoplastic polyurethane, acrylic, polyester, other polymers, or other suitable materials). Layer 108 may also help provide a waterproof sealant on outer layer 22 to prevent moisture and other contaminants from entering keyboard 12 through outer layer 22.

Because carrier film 78 and signal lines 46 are at least partially transparent, light 44 from light sources 40 can pass through openings 38 without a user being able to see signal lines 46 though openings 38.

Figure 14:
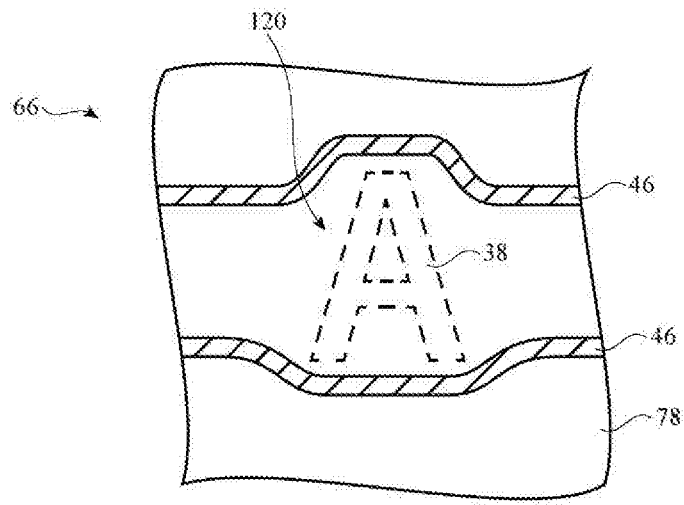
FIG. 14 is a top view of an illustrative touch sensor substrate in which touch sensor signal lines circumvent an opening that forms an alphanumeric character for a key in accordance with an embodiment.
Figure 15:
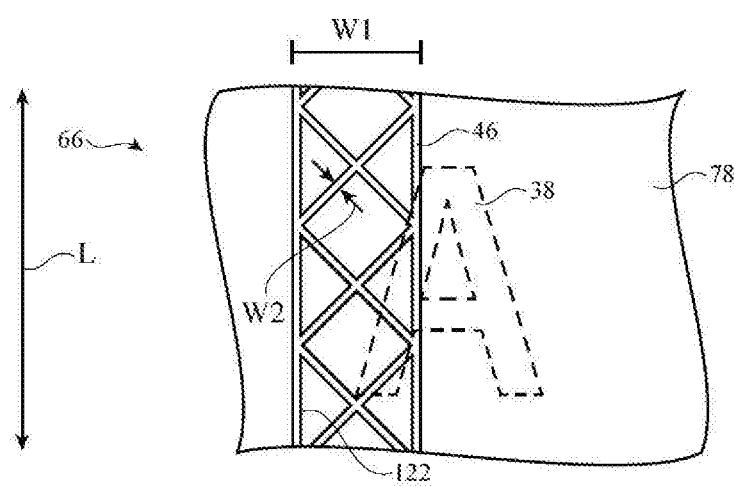
FIG. 15 is a top view of an illustrative touch sensor substrate in which touch sensor signal lines are formed from a metal mesh in accordance with an embodiment.

FIGS. 14 and 15 show illustrative arrangements in which non-transparent materials are used to form touch sensor signal lines 46 and in which touch sensor signal lines 46 are modified to minimize their visibility through openings 38. Although the examples of FIGS. 14 and 15 show signal lines 46 on carrier layer 78, signal lines 46 of FIGS. 14 and 15 may instead be formed directly on outer layer 22 (as in the example of FIG. 10).

In the example of FIG. 14, touch sensor signal lines 46 are specifically placed on substrate 78 to avoid overlapping openings 38. In other words, adjacent signal lines 46 may spread apart from one another to form a gap such as gap 120 that overlaps opening 38. In arrangements where signal lines 46 are formed on substrate 78 that is behind outer layer 22 in keyboard 12 (as shown in the example of 13), openings 38 may be formed in outer layer 22 and light 44 may pass through gap 120 to reach opening 38 in outer layer 22. In arrangements where signal lines 46 are formed directly on outer layer 22 (as shown in the example of FIG. 10), opening 38 may be formed in layer 22 between signal lines 46. By circumventing opening 38 such that signal lines 46 and openings 38 are non-overlapping, signal lines 46 may be out of a user's sight and undetectable through openings 38.

In the example of FIG. 15, signal lines 46 are formed using a mesh structure such as mesh 122. Mesh 122 may be formed from metal wires or a sheet of metal with openings (e.g., an array of rectangular openings or openings of other shapes). The openings in mesh 122 may be filled with air or filler material 62 (e.g., elastomeric material, etc.). Mesh 122 may be formed from wires, fine lines of a metal thin-film, or other material. The lines may be sufficiently narrow to be invisible to a user of keyboard 12. Width W2 of the individual traces in mesh 122 may, for example, be between 25 microns and 35 microns, between 20 microns and 40 microns, between 10 microns and 50 microns, greater than 20 microns, or less than 20 microns. Since mesh 122 that forms signal lines 46 is undetectable by the human eye, users of keyboard 12 will be unable to see signal lines 46 even when signal liens 46 overlap openings 38 in layer 22.

To reduce the electrical resistance of signal lines 46, the overall width W1 of signal line 46 may be significantly wider than width W2 of individual traces that make up signal line 46. The ratio of width W1 to width W2 may, for example, be 2:1, 10:1, 50:1, 100:1, or other suitable ratio. In the example of FIG. 15, the lines of mesh 122 are oriented so that they run at 45° relative to length L of signal line 46. In other arrangements, the lines of mesh 122 may run parallel and perpendicular to length L of signal line 46. Other mesh orientations and layouts may be used if desired.

Figure 16:
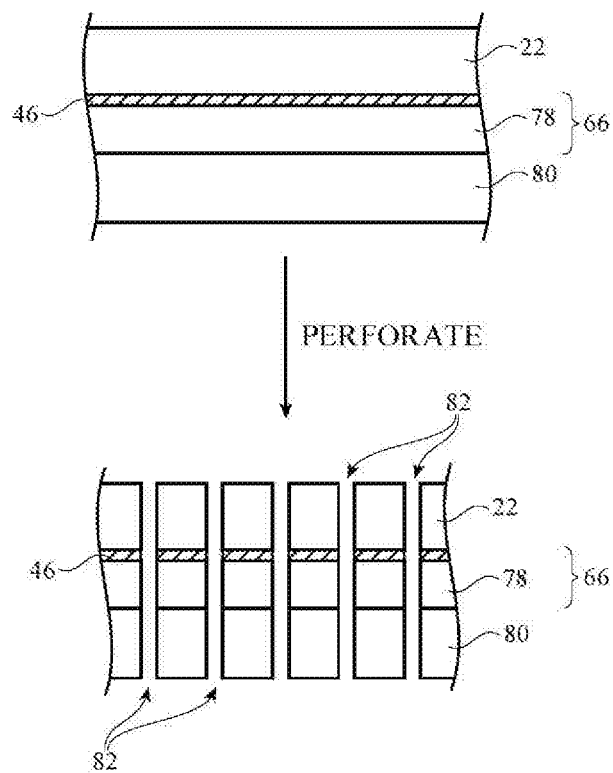
FIG. 16 is a diagram showing illustrative steps involved in forming openings through an outer fabric layer and a touch sensor layer in accordance with an embodiment.

FIG. 16 shows how perforations may be formed in outer layer 22 and touch sensor 66. As shown in FIG. 16, carrier layer 78 may be attached to outer layer 22. Touch sensor signal lines 46 may be formed on carrier 78 and may be sandwiched between layer 22 and carrier 78. If desired, signal lines 46 may be formed directly on layer 22 (as in the example of FIG. 10). The arrangement of FIG. 16 in which signal lines 46 are formed on carrier 78 is merely illustrative. If desired, additional layers such as layer 80 may be attached to the lower surface of carrier 78. Layer 80 may, for example, be a sealant (e.g., epoxy, polyurethane, or other sealant) or may be part of key 16 (e.g., may form part of key member 24).

Following attachment of carrier 78 to layer 22, perforations 82 may be formed through outer layer 22, signal lines 46, carrier 78, and layer 80. Openings 82 of FIG. 16 may be formed by stamping (punching), cutting, machining, plasma cutting, waterjet cutting, heating, ablation, chemical removal (e.g., polymer dissolving techniques, metal etching techniques, etc.), laser-based techniques (sometimes referred to as laser hole formation or laser drilling), and/or other suitable material removal techniques. By forming openings 82 after attaching layers 22, 78, and 80, openings 82 may pass completely through the entire stack, offering a clear path for light 44 from light sources 40 to exit keyboard 12 to illuminate key 16 (FIG. 3).

Figure 17:
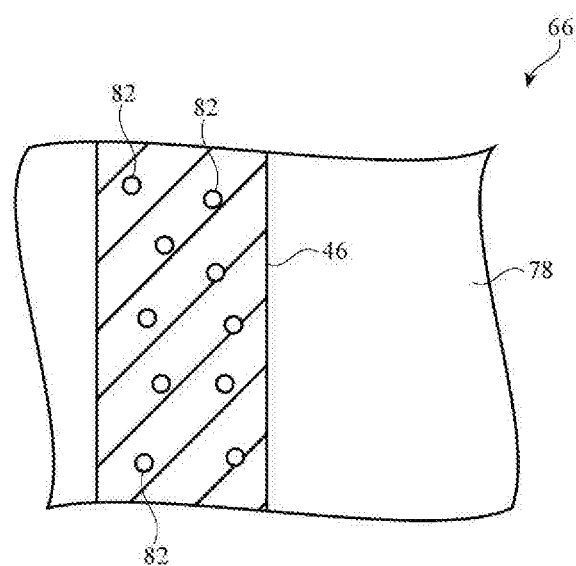
FIG. 17 is a top view of an illustrative touch sensor in which openings are formed in touch sensor signal lines in accordance with an embodiment.

FIG. 17 shows a top view of the perforated touch sensor layer of FIG. 16. As shown in FIG. 16, touch sensor layer 66 may include signal lines 46 formed on carrier 78. Openings 82 may be formed in touch sensor 62, thereby allowing light to pass through signal lines 46. As with openings 38, openings 82 may be arranged to form an alphanumeric character or other shape that illuminates and labels key 16 for a user of keyboard 12. Although openings 82 pass through signal lines 46, the resistance of signal lines 46 can be decreased by increasing the width of signal lines 46 on layer 78.

The example of FIG. 16 in which openings 82 are formed after attaching layers 22, 78, and 80 is merely illustrative. If desired, openings such as openings 82 may be formed during the process of fabricating some or all layer 22, layer 78, and/or layer 80 (e.g., by molding openings into layer 22, 78, or 80 during a plastic molding process, by intertwining strands of material so that openings are formed as layer 22 is constructed, or by using other fabrication techniques in which openings such as opening 82 are formed during fabrication of layer 22, 78, or 80 rather than by removing material from layers 22, 78, and 80 after layers 22, 78, and 80 have been fabricated).

Figure 18:
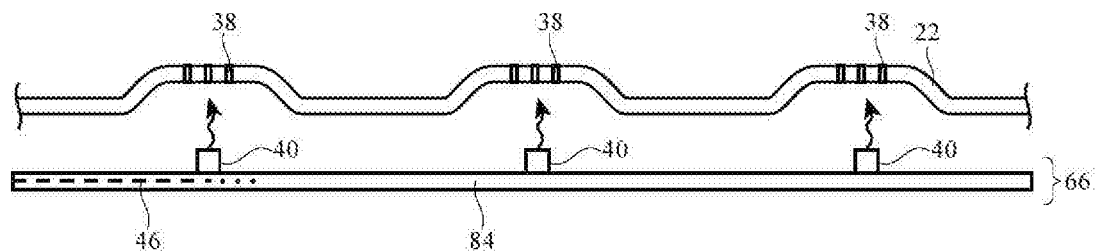
FIG. 18 is a cross-sectional side view of an illustrative keyboard in which light sources are interposed between a touch sensor and an outer fabric layer in accordance with an embodiment.

If desired, touch sensor 66 may be placed behind the light sources in keyboard 12 to avoid blocking light and to minimize the appearance of the touch sensor signal lines through openings in outer layer 22. As shown in FIG. 18, for example, touch sensor 66 may be placed behind light sources 40 such that light sources 40 emit light away from touch sensor 66. Touch sensor 66 may, for example, be formed from a substrate such as flexible polymer substrate 84 with conductive traces that form signal lines 46. If desired, light sources 40 may be mounted and electrically connected to conductive traces on substrate 84 (e.g., substrate 84 may include a first set of traces that form touch sensor signal lines 46 and a second set of traces that provide power and control signals to light-emitting diodes 40). Because signal lines 46 are located behind light sources 40, light 44 will be unobstructed by signal lines 46 and users will be unable to see signal lines 46 through openings 38.

Figure 19:
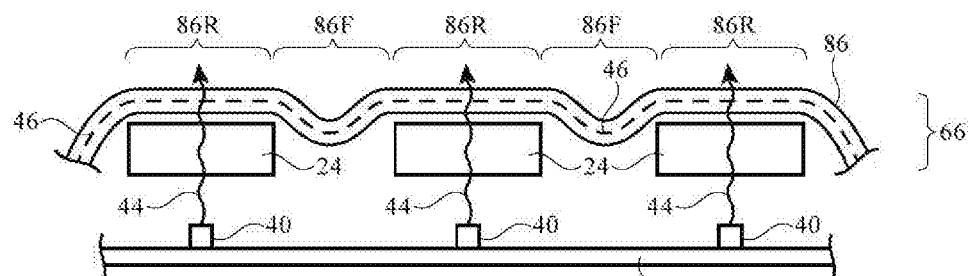
FIG. 19 is a cross-sectional side view of illustrative keyboard keys that are overlapped by a touch sensor having transparent signal line segments in rigid portions of the touch sensor and non-transparent signal line segments in flexible portions of the touch sensor in accordance with an embodiment.

If desired, signal lines 46 may have some portions that are transparent and other portions that are non-transparent. This type of arrangement is shown in FIG. 19. As shown in FIG. 19, signal lines 46 of touch sensor 66 may be incorporated into a layer such as layer 86 over key members 24 of keys 16. Layer 86 may be a fabric layer located under outer layer 22 (as in the example of FIGS. 7 and 8), may be a fabric layer that forms outer layer 22 (as in the example of FIG. 9), or may be a non-fabric layer such as a layer of polymer (as in the example of FIG. 13).

Layer 86 may have rigid portions and flexible portions. For example, layer 86 may have rigid portions 86R that overlap key members 24 and flexible portions 86F in portions of layer 86 that do not overlap key members 24. Flexible portions 86F may allow rigid portions 86R of layer 86 to move downward when a user presses down on keys 16. Rigid portions 86R may be supported by key members 24 and may remain rigid and flat during key press events.

Because portions 86R of layer 86 remain flat, the materials that form signal lines 46 in regions 86R need not be as flexible as the materials that are used to form signal lines 46 in regions 86F that need to bend and flex. For example, segments of signal lines 46 in rigid portions 86R of layer 86 may be formed from indium tin oxide or other transparent conductive material, whereas segments of signal lines 46 flexible portions 86F of layer 86 may be formed from more flexible conductive materials such as metal (e.g., flexible silver ink or other metal), conductive strands in fabric, or polymer with conductive filler (e.g., flexible silicone embedded with conductive particles). Because signal lines 46 are transparent in rigid portions 86R, light 44 will not be obstructed in these regions and a user will be unable to see signal lines 46 through openings 38 in layer 22 (FIG. 3).

Figure 20:
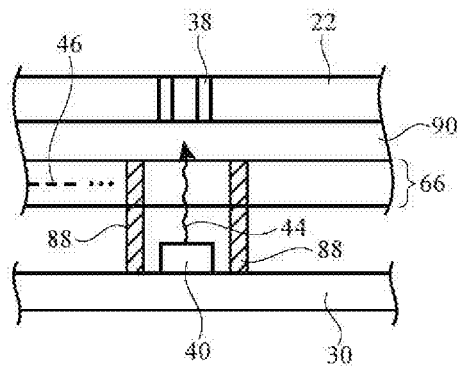
FIG. 20 is a cross-sectional side view of an illustrative keyboard key in which a light-reflecting wall surrounds a light source that illuminates the key in accordance with an embodiment.

If desired, a light guide tunnel may be used to help guide light from light source 40 through touch sensor 66. An example of this type of arrangement is shown in FIG. 20. As shown in FIG. 20, light source 40 may be surrounded by a wall such as light-reflective wall 88 (e.g., a metal wall or a wall that is coated with a reflective material). Wall 88 may surround each light source 40 to contain light 44 and guide light 44 through touch sensor layer 66. In the example of FIG. 20, light-reflective wall 88 extends from substrate 30 through touch sensor 66. If desired, an optional diffuser such as diffuser 90 may be placed between touch sensor 66 and outer layer 22. Diffuser 90 may be formed from one or more layers of polymer and may include light-scattering features such as voids, inorganic light-scattering particles, other light-scattering structures, dyes, pigments, etc. Touch sensor signal lines 46 may be specifically placed or formed in touch sensor 66 to avoid (circumvent) walls 88.

In arrangements where touch sensor 66 of FIG. 20 is formed from fabric (e.g., as in the example of FIG. 6), walls 88 may pass through touch sensor 66 by passing between adjacent strands in the fabric. In arrangements where touch sensor 66 of FIG. 20 is formed from conductive traces on a polymer substrate, walls 88 may pass through touch sensor 66 by forming openings in the substrate and subsequently inserting walls in the openings, or walls 88 may pass through touch sensor 66 by insert molding the touch sensor substrate around walls 88. The presence of walls 88 in touch sensor 66 helps guide light through touch sensor 66 while also preventing signal lines 46 from overlapping openings 38 and becoming visible to a user.

Figure 21:
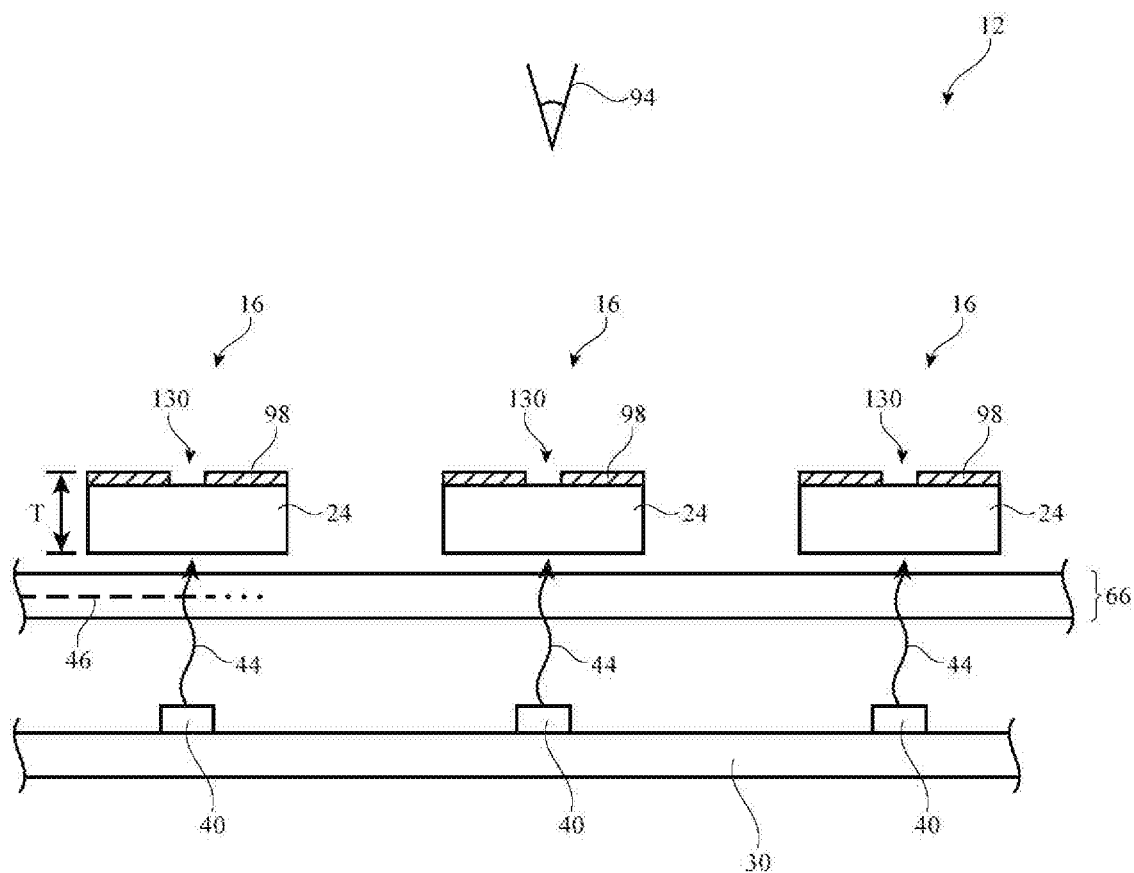
FIG. 21 is a cross-sectional side view of illustrative keyboard keys in which key members diffuse light to obscure touch sensor lines in accordance with an embodiment.

In the example of FIG. 21, touching sensing layer 66 is interposed between key members 24 and light sources 40. In this type of arrangement, touch sensing layer 66 may be a fabric touch sensor of the type shown in FIG. 6 or may be a touch sensor formed from conductive traces on a substrate (e.g., a flexible polymer film or other substrate).

Key member 24 may be formed from a light diffusing polymer and may include light-scattering features such as voids, inorganic light-scattering particles, other light-scattering structures, dyes, pigments, etc. Key members 24 may have sufficient thickness T to effectively diffuse light 44 and obscure touch sensor signal lines 46 so that lines 46 are not visible to viewer 94.

To form the desired alphanumeric character on keys 16, a light-masking coating such as coating 98 (e.g., printed ink or other coating material) may be formed on key members 24. Coating layer 98 may have openings 130 that form the desired alphanumeric character or other shape. Diffused light 44 may travel through openings 130 to thereby form an illuminated label on key 16. The light-diffusing properties of key member 24 may help prevent lines 46 from being viewable through openings 130.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
a substrate;
an array of keys, wherein each key in the array of keys has a switch mounted on the substrate and a movable key member that overlaps the switch;
a touch sensor layer having a first surface facing the movable key members and a second surface facing the substrate, wherein the touch sensor layer is interposed between the movable key members and the substrate, the first surface is exposed between adjacent keys, and the touch sensor layer comprises conductive traces formed on a flexible substrate; and
a light source mounted to the substrate, wherein the light source illuminates the movable key members.

2. The electronic device defined in claim 1 wherein the flexible substrate comprises fabric.

3. The electronic device defined in claim 1 wherein the touch sensor layer has an array of perforations through which light from the light source passes.

4. The electronic device defined in claim 3 wherein the perforations pass though the conductive traces.

5. The electronic device defined in claim 1 wherein the touch sensor layer comprises rigid regions and flexible regions.

6. The electronic device defined in claim 5, wherein the rigid regions are overlapped by the movable key members and include transparent conductive traces and wherein the flexible regions comprise non-transparent conductive traces.

7. The electronic device defined in claim 1 wherein the touch sensor layer is configured to receive multitouch input.

8. The electronic device defined in claim 1 wherein the movable key members are formed from light diffusing material.

9. The electronic device defined in claim 8 wherein each of the movable key members has a printed ink layer.

10. A keyboard, comprising:
an array of keys, wherein each key has a movable key member;
an array of light sources that illuminate the array of keys; and
a fabric touch sensor layer that includes conductive strands woven in a fabric layer that form capacitive touch sensor electrodes, wherein the fabric layer is disposed between the array of light sources and the movable key members.

11. The keyboard defined in claim 10 wherein the movable key members comprise light diffusing material.

12. The keyboard defined in claim 11 wherein each of the movable key members has first and second opposing surfaces, the first surface faces the fabric layer, and the second surface is coated with a light-masking coating.

13. The keyboard defined in claim 12 wherein the light-masking coating has openings that are arranged to form alphanumeric characters.

14. The keyboard defined in claim 13 wherein the light diffusing material of the key members obscures the conductive strands from view.

15. A keyboard, comprising:
an array of switches;
at least one key having a key cap that is configured to press against and close a switch of the array of switches, wherein the key cap is formed from light diffusing material with light scattering particles and has a light blocking layer that forms an alphanumeric character;
a flexible capacitive touch sensor layer with conductive traces formed on a flexible substrate overlapped by the key cap; and
a light source, wherein the light source emits light through the flexible capacitive touch sensor layer to illuminate the key cap and the light diffusing material with light scattering particles of the key cap obscures the conductive traces from view.

16. The keyboard defined in claim 15 wherein the flexible capacitive touch sensor layer is interposed between the switch and the key cap.

17. The keyboard defined in claim 16 wherein the flexible capacitive touch sensor layer comprises a fabric with conductive signal lines.

18. The keyboard defined in claim 15 wherein the light blocking layer comprises a light-masking coating.

\* \* \* \* \*